(12) United States Patent
Hsu (10) Patent No.: US 7,608,511 B1
(45) Date of Patent: Oct. 27, 2009

(54) FABRICATION METHOD OF TRENCHED POWER MOSFET WITH LOW GATE IMPEDANCE

(75) Inventor: Hsiu Wen Hsu, Hsinchu County (TW)

(73) Assignee: Niko Semiconductor Co., Ltd., Taipei (TW)

( * ) Notice: Subject to any disclaimer, the term of this patent is extended or adjusted under 35 U.S.C. 154(b) by 0 days.

(21) Appl. No.: 12/289,860

(22) Filed: Nov. 6, 2008

(51) Int. Cl.
*H01L 21/336* (2006.01)

(52) U.S. Cl. .............. 438/270; 438/259; 257/E21.655

(58) Field of Classification Search ........... 438/259, 438/270–271, 589; 257/E21.655

See application file for complete search history.

(56) References Cited

U.S. PATENT DOCUMENTS 6,489,204 B1 * 12/2002 Tsui .................... 438/270

* cited by examiner

*Primary Examiner*—Thanhha Pham
(74) *Attorney, Agent, or Firm*—Rosenberg, Klein & Lee (57) ABSTRACT

A fabrication method of a trenched power MOSFET with low gate impedance is provided. The fabrication method comprising the steps of: forming a plurality of trenches in an epitaxial layer; forming a gate oxide layer on the epitaxial layer; forming a plurality of polysilicon gates in the trenches; implanting dopants with a first conductivity type into the epitaxial layer; driving-in the dopants in an oxygen-free environment to form a body; implanting dopants with a second conductivity type into the body; driving-in the dopants with the second conductivity type in an oxygen-free environment to form a plurality of source regions; forming self alignment silicide on the polysilicon gates by using the gate oxide layer as a mask; depositing a dielectric layer on the epitaxial layer and forming a window therein exposing the source regions; and forming a heavily doped region of the first conductivity type in the body beneath the window.

14 Claims, 9 Drawing Sheets

FABRICATION METHOD OF TRENCHED POWER MOSFET WITH LOW GATE IMPEDANCE

BACKGROUND OF THE INVENTION

1. Field of the Invention

The present invention is related to a fabrication method of a trenched power Metal Oxide Semiconductor Field Effect Transistor (MOSFET), and in particular, to a fabrication method of a trenched power MOSFET with low gate impedance.

2. Description of Related Art

To match the requirements of energy conservation and reduction of the system power loss, higher efficiency of power converting is required. These requirements for design standard which keep pace with the times are the severe challenge to the designer of power converter. Thus, the role of new power device in the high efficiency converter is more important day by day. Wherein, Power MOSFET has been applied widespreadly in various power converters.

FIGS. 1A to 1E show the fabrication process of the conventional trenched power MOSFET. And an N-type power MOSFET is taken as an example.

Figure 1A:
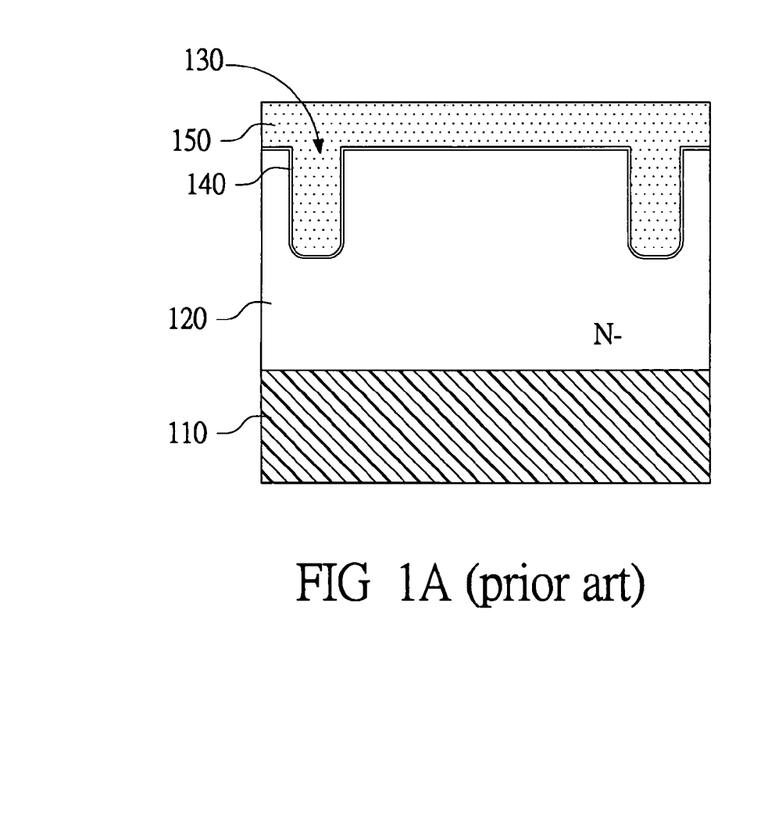
FIGS. 1A to 1E are schematic views showing a fabrication method of the conventional trenched power MOSFET.

First, referring to FIG. 1A, an N-type epitaxial layer 120 is formed on the N-type silicon substrate 110. Then, the location of gate trenches 130 is defined by using a mask (not shown). Afterwards, a plurality of gate trenches 130 is formed in the epitaxial layer 120 by undertaking the dry etching process. Thereafter, a gate oxide layer 140 is formed on the exposed surface in the gate trench 130. Afterwards, the N-type epitaxial layer 120 is covered by a polysilicon layer 150 and the gate trenches 130 are completely filled with the polysilicon layer 150.

Figure 1B:
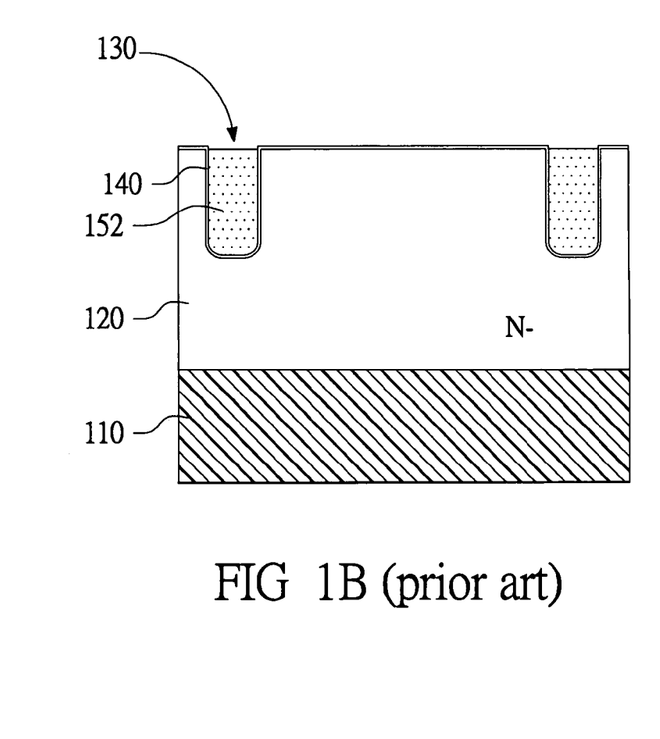

Then, referring to FIG. 1B, an etching back process is undertaken to remove part of the polysilicon layer 150 which is located above the upper surface of the epitaxial layer 120. And, a plurality of polysilicon gates 152 left in the gate trenches is formed. Later on, referring to FIG. 1C, a blanket ion implantation process is performed to implant P-type dopants into the N-type epitaxial layer 120. Then, the implanted P-type dopants are driven in by undertaking a thermal process, in order to form a P-body 122 in the N-type epitaxial layer 120.

Figure 1C:
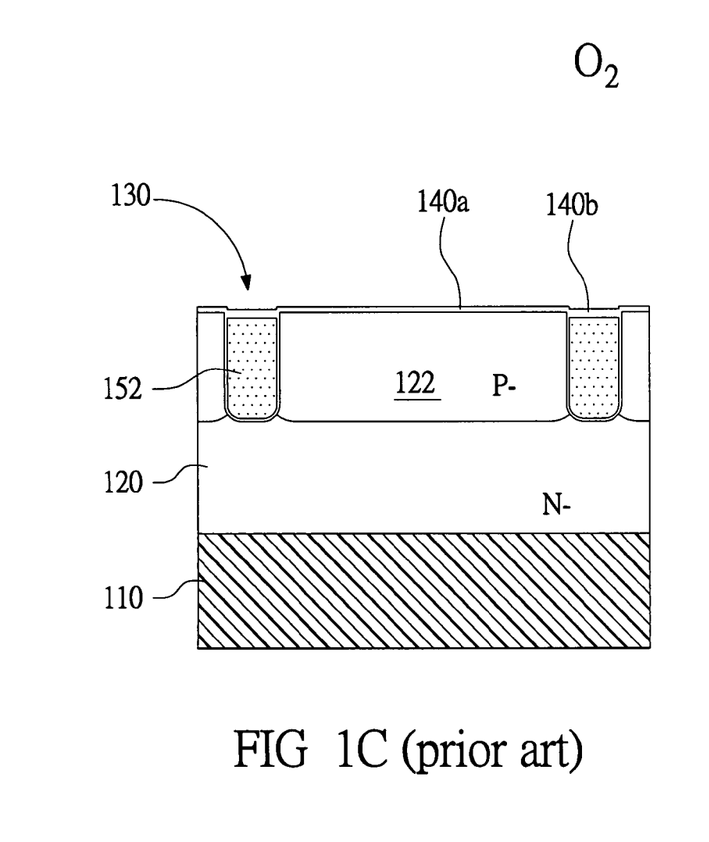
Figure 1D:
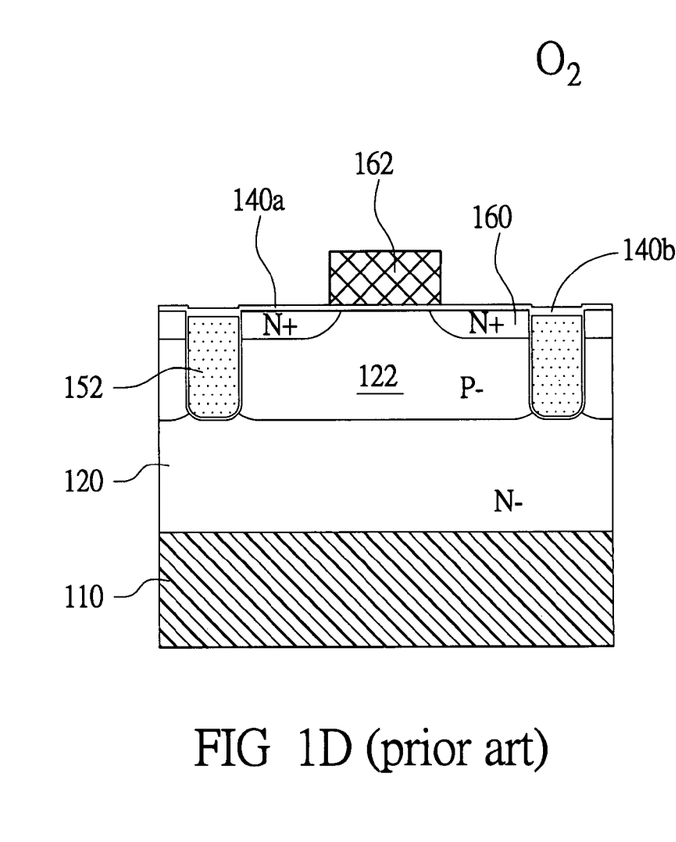

The following step, referring to FIG. 1D, a patterned photoresistant layer 162 is formed by using a mask (not shown), in order to define the location of source regions. Then, the N-type dopants are implanted into the P-body 122 by performing an ion implantation process. Afterwards, the implanted N-type dopants are driven in by undertaking a thermal process, in order to form a plurality of N-type source regions 160 in the P-body 122.

Figure 1E:
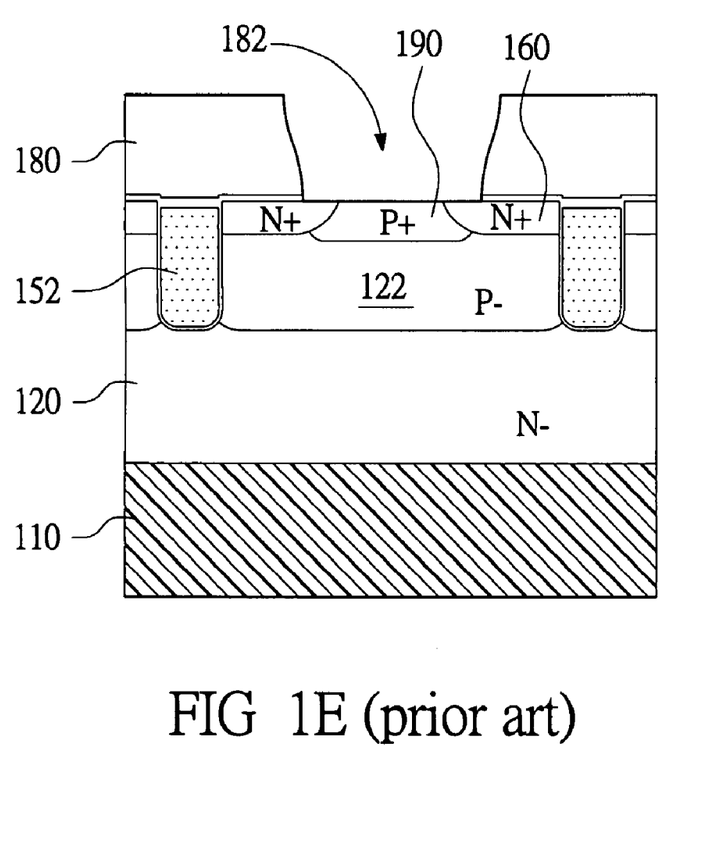

Then, referring to FIG. 1E, a dielectric layer 180 (for example, a BPSG layer) is deposited to cover the polysilicon gates 152, the source regions 160 and the exposed P-body 122. Thereafter, the location of a contact window 182 is defined in the dielectric layer 180 by using a mask (not shown). And the contact window 182 is formed by undertaking the etching process, in order to expose the source regions 160 beneath the dielectric layer 180 and the P-body 122 between the two source regions 160. Later on, through the contact window 182, an ion implantation process is undertaken to implant P-type dopants and a P-type heavily-doped region 190 is formed between the two source regions 160. The fabrication method of trenched power MOSFET is thus completed.

For higher integration, the dimension of MOSFET device becomes smaller. Hence, the width and depth of the gate trench 130 have to become smaller correspondingly. However, the smaller dimension of the gate trench 130 will lead the high resistance of the polysilicon gate 152. This will have a disadvantage to the switching speed of the transistor and also cause the increase of switching loss.

Generally speaking, polysilicon material has high resistivity (usually is bigger than 1 mΩ-cm). In order to reduce resistance of the polysilicon gate 152, a typical fabrication method is performed to form a self-alignment silicide on the polysilicon gate 152. Silicide has lower resistance than polysilicon material; therefore, this is an effective solution to the problem of high gate impedance.

As to the process of self alignment silicide, the formation of silicide has to be delayed after the steps of ion implantation and thermal drive-in, in order to effectively control the thickness of silicide and prevent the pollution causing by diffusion of metal atoms in high-temperature environment. However, referring to FIGS. 1B and 1C, the step of ion drive-in is usually performed in a high-oxygen environment, in order to form a silicon oxide layer 140a on the surface of the epitaxial layer 120, and to prevent the implanted ion from spreading outwards. But, the polysilicon gates 152 in the gate trenches 130 are also exposed. Hence, a silicon oxide layer 140b is formed on the surface of the polysilicon gates 152. In addition, because the polysilicon gates 152 is usually composed of high concentration dopants, the thickness of the silicon oxide layer 140b which is formed on the surface of the polysilicon gates 152 will be even greater than the thickness of the silicon oxide layer 140a which is formed on the surface of the epitaxial layer 120.

It is worth noting that the silicon oxide layer 140a and 140b will hinder the formation of silicide. Therefore, referring to FIG. 1D, in order to form the self alignment silicide (salicide), it is necessary to remove the silicon oxide layer 140b on the surface of the polysilicon gates 152. Meanwhile, the silicon oxide layer 140a on the surface of the epitaxial layer 120 has to be reserved. However, the thickness of the silicon oxide layer 140b on the surface of the polysilicon gates 152 is greater than the thickness of silicon oxide layer 140a on the surface of epitaxial layer 120. Therefore, it is difficult to perform the etching process merely removing the silicon oxide layer 140b on the surface of the polysilicon gates 152 and reserving the silicon oxide layer 140a on the surface of the epitaxial layer 120. As a result, it is difficult to use the silicon oxide layer 140a on the surface of the epitaxial layer 120 as a mask to form silicide on the surface of the polysilicon gates 152.

SUMMARY OF THE INVENTION

In view of the above-mentioned issues in the conventional art, the present invention provides a method of fabricating the trenched power MOSFET, through which the self-alignment silicide is formed on the polysilicon gates.

To achieve the aforementioned objectives, the present invention provides a method of fabricating the trenched power MOSFET. This fabrication method comprises the steps of: (a) providing a substrate and forming an epitaxial layer thereon; (b) forming a plurality of gate trenches in the epitaxial layer; (c) forming a gate oxide layer on the exposed surface of the epitaxial layer; (d) forming a plurality of polysilicon gates in the gate trenches; (e) implanting dopants with a first conductivity type into the epitaxial layer below the gate oxide layer; (f) driving-in the dopants with the first conductivity type in an oxygen-free environment to form a body; (g)

implanting dopants with a second conductivity type into the body below the gate oxide layer; (h) driving-in the dopants with the second conductivity type in an oxygen-free environment to form a plurality of source regions; (i) forming self alignment silicide (salicide) on the exposed surface of the polysilicon gates by using the gate oxide layer as a mask; (j) depositing a dielectric layer covering the epitaxial layer and the polysilicon gates and forming a contact window in the dielectric layer to expose the source regions and part of the body; and (k) forming a heavily-doped region with the first conductivity type into the body beneath the contact window.

Other objectives and advantages relating to the present invention will be construed as well in the following texts and appended drawings.

DETAILED DESCRIPTION OF PREFERRED EMBODIMENTS

FIGS. 2A to 2G are schematic views showing a preferred embodiment of a trenched power MOSFET in accordance with the present invention. An N-type power MOSFET is explained as an example. First, referring to FIG. 2A, an N-type silicon substrate 210 is provided, and an N-type epitaxial layer is formed on the N-type silicon substrate 210. Later on, the location of gate trenches 230 is defined by using a mask (not shown). A plurality of gate trenches 230 is then formed in the epitaxial layer 220 by undertaking the dry etching process. Thereafter, a gate oxide layer 240 is formed to cover the exposed surface of the epitaxial layer 220. The gate oxide layer 240 not only cover the inside wall of the gate trenches 230, but also cover the upper surface of the epitaxial layer 220. Then, a polysilicon gate 250 is deposited to cover the epitaxial layer 220 completely and to fill in the gate trenches 230. The following step, referring to FIG. 2B, an etching back process is undertaken to remove a part of the polysilicon gates 250 which is located above the upper surface of the epitaxial layer 220 and a plurality of polysilicon gates 252 is formed inside the gate trenches 230.

Figure 2A:
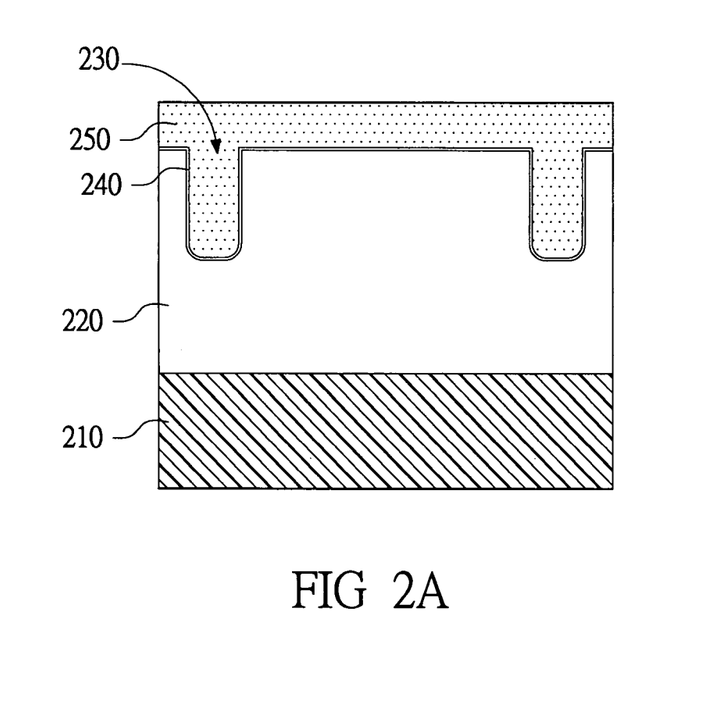
FIGS. 2A to 2G are schematic views showing a preferred embodiment of the fabrication method of a trenched power MOSFET in accordance with the present invention.
Figure 2B:
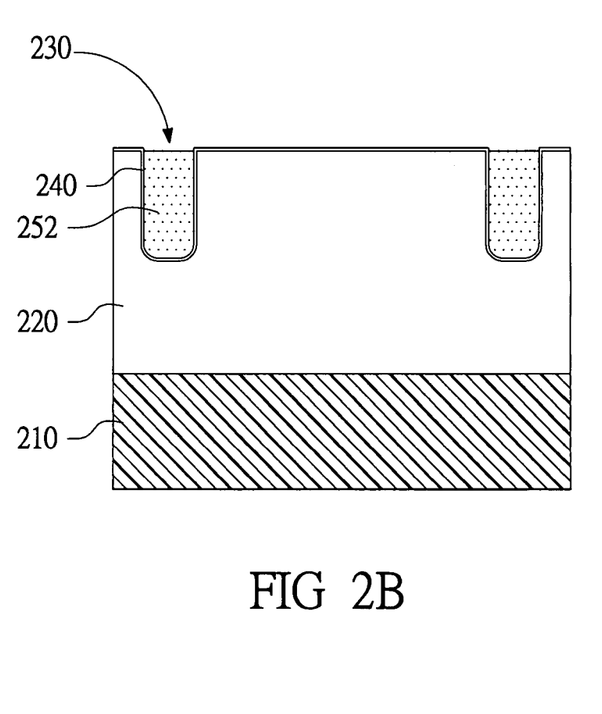
Figure 2C:
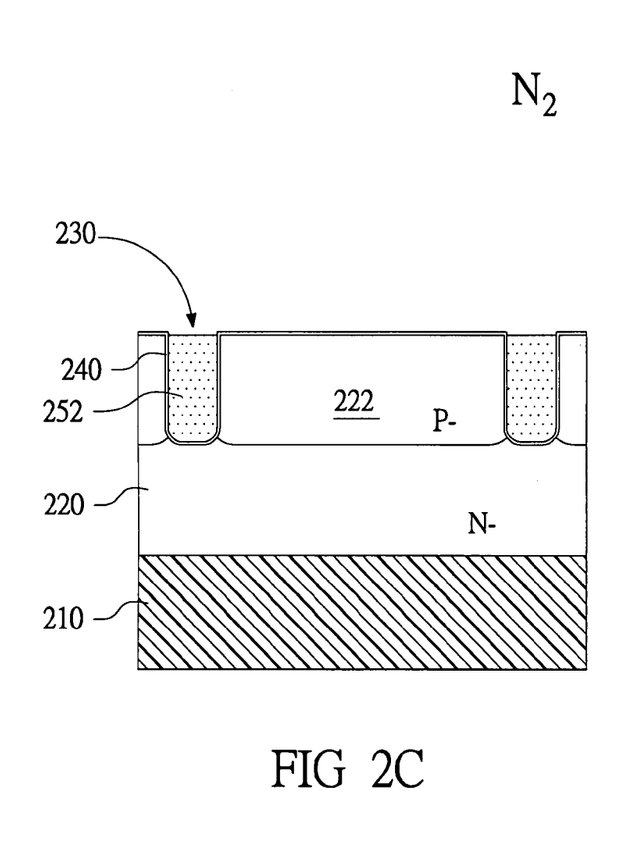

Then, referring to FIG. 2C, an ion implantation process is performed to implant the P-type dopants into the epitaxial layer 220 under the gate oxide layer 240. Thereafter, the implanted P-type dopants are driven in by undertaking the thermal process in a pure-nitrogen environment, in order to form a P-type body 222 inside the epitaxial layer 220. It is worth noting that the upper surface of the epitaxial layer 220 is covered by the gate oxide layer 240 during the aforementioned ion implantation and drive-in steps of the P-type dopants. The existence of the gate oxide layer 240 can prevent the implanted P-type dopants from spreading outwards. Therefore, the ion drive-in step of the present invention is not necessary to be performed in a high-oxygen environment. According to the preferred embodiment of the present invention, the environment temperature of this ion drive-in step is around 1000° C.~1150° C., and the heating-up time is about 20~50 minutes.

Figure 2D:
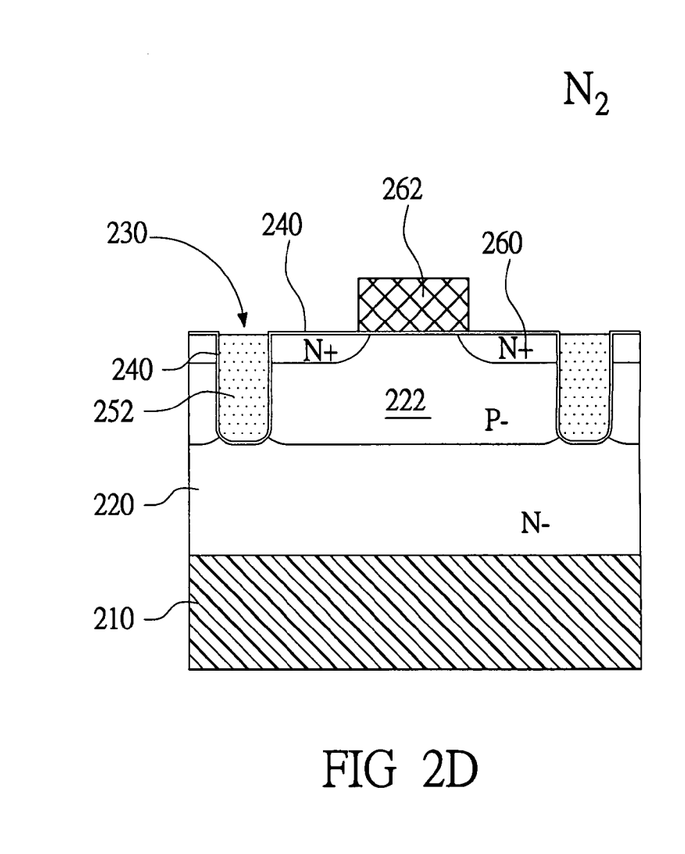

The following step, referring to FIG. 2D, a patterned photoresistant layer 262 is formed on the upper surface of the gate oxide layer 240 by using a mask (not shown), in order to define the location of source regions. Later on, the N-type dopants are implanted into the P-type body 222 below the gate oxide layer 240. Afterwards, the implanted N-type dopants are driven in by undertaking the thermal process in a pure-nitrogen environment, in order to form a plurality of N-type source regions 260 in the P-body 222. It is worth noting that the upper surface of the epitaxial layer 220 is covered by the gate oxide layer 240 during the aforementioned ion implantation and drive-in steps of the N-type dopants. Hence, the ion drive-in step of the present invention is not necessary to be performed in a high-oxygen environment. According to the preferred embodiment of the present invention, the environment temperature of this ion drive-in step is around 850° C.~950° C., and the heating-up time is about 15~30 minutes.

Figure 2E:
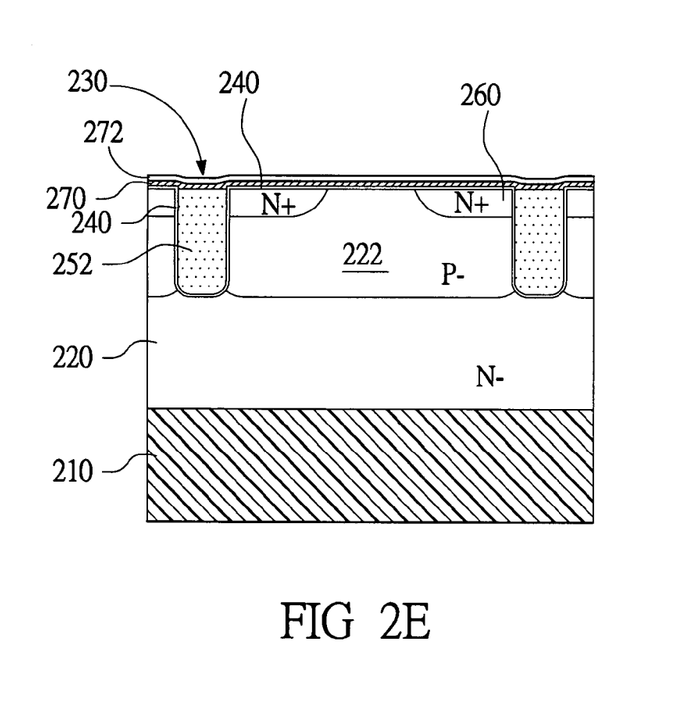

Then, referring to FIG. 2E, a metal layer 270 is formed to cover the exposed surface of the gate oxide layer 240 and the polysilicon gates 252 by undertaking a sputtering process. Afterwards, referring to FIG. 2F, a thermal process is carried out to have the metal layer 270 reacting with the polysilicon gates 252 to form self alignment silicide 274 on the upper surface of the polysilicon gates 252. For the preferred embodiment, the metal layer 270 can be a titanium metal layer or a cobalt metal layer, in order to react with the polysilicon gates 252 to form Ti-silicide or Co-silicide respectively. In addition, a titanium nitride layer 272 may be used as a protective layer to cover the upper surface of the metal layer 270. Besides, the thermal process undertaken in the fabrication step of FIG. 2F could be a conventional rapid thermal process to avoid the formation of silicon oxide to deter the formation of metal silicide.

Figure 2F:
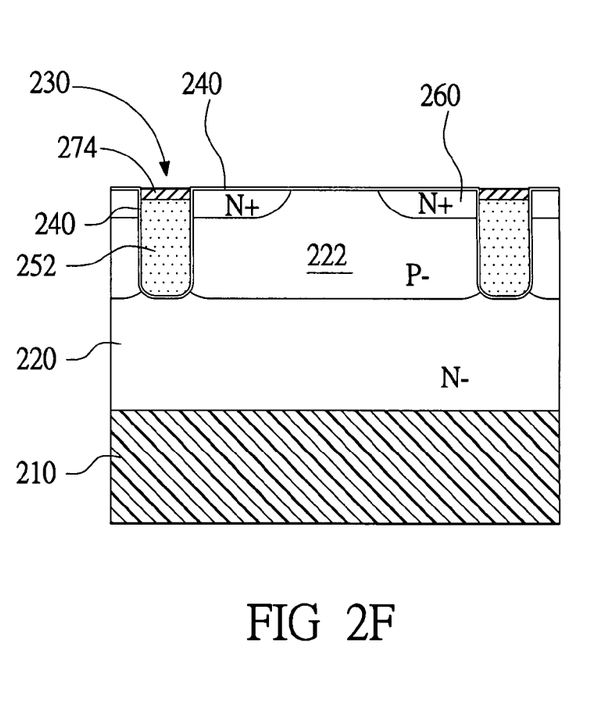
Figure 2G:
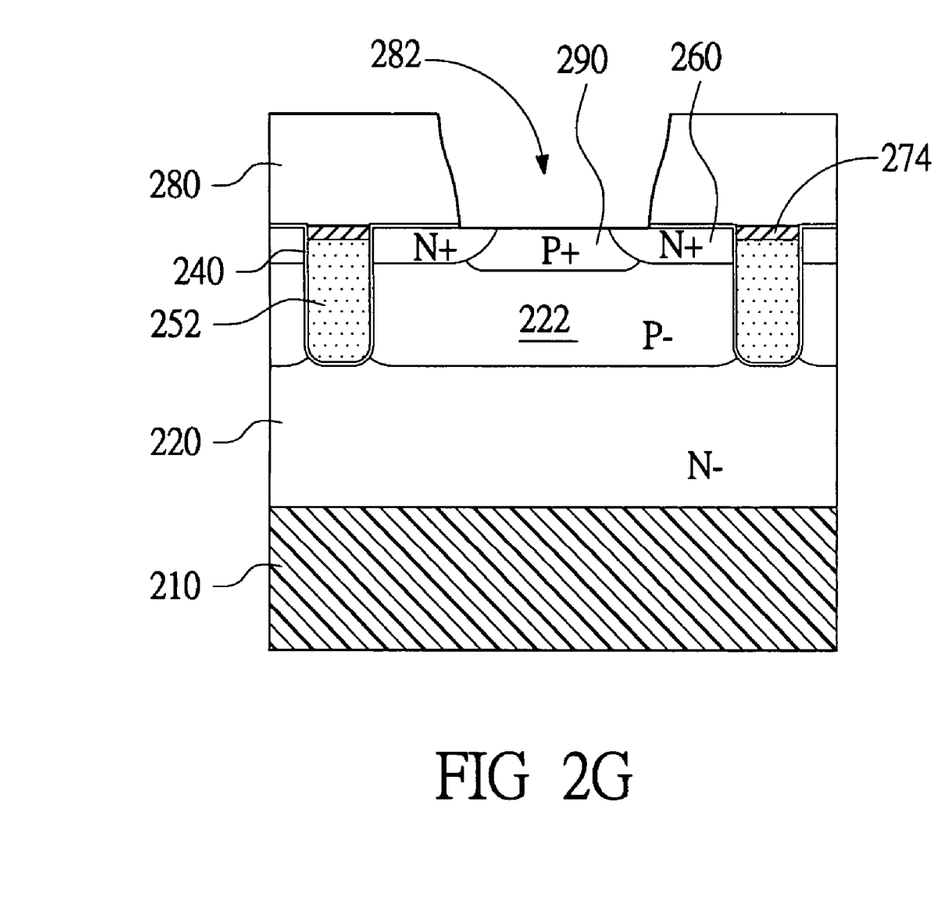

Later on, referring to FIGS. 2F and 2G, the titanium nitride layer 272 and the remainder of the titanium metal layer 270 are removed. Then, a dielectric layer 280 is formed to cover the epitaxial layer 220 and the polysilicon gates 252 (including the self alignment silicide 274 on the upper surface of the polysilicon gates 252). A contact window 282 is then formed in the dielectric layer 280 by undertaking the etching process, in order to expose the source regions 260 and the P-type body 222 which is located between two neighboring source regions 260. Thereafter, through the contact window 282, an ion implantation process is undertaken to form a P-type heavily-doped region 290 inside the P-body 222. The fabrication method in accordance with trenched power MOSFET of the present invention is thus finished.

Referring FIGS. 2C and 2D, in the aforementioned ion implantation and drive-in steps, a thin oxide layer may be formed on the exposed surface of the polysilicon gates 252 by the oxidation due to the remained oxygen in the environment. This may affect the followed fabrication step of self alignment silicide 274. However, it is obviously that the thickness of the thin oxide layer is much smaller than the thickness of the gate oxide layer 240. Thus, the thin oxide layer on the surface of the polysilicon gates 252 is able to be removed by performing an etching process after the formation of the source regions 260; and the gate oxide layer 240 on the epitaxial layer 220 will not be totally removed.

It is worth noting that, in the aforementioned embodiment, the ion drive-in steps of the P-type body 222 and the N-type region sources 260 are performed in the pure-nitrogen environment. However, the present invention is not limited to this scope. The ion drive-in steps can be performed in the oxygen-free environments, such as vacuum environment or an inert gas environment, which is capable of avoiding the formation the silicon oxide layer on the exposed surface of the polysilicon gates 252.

Figure 3A:
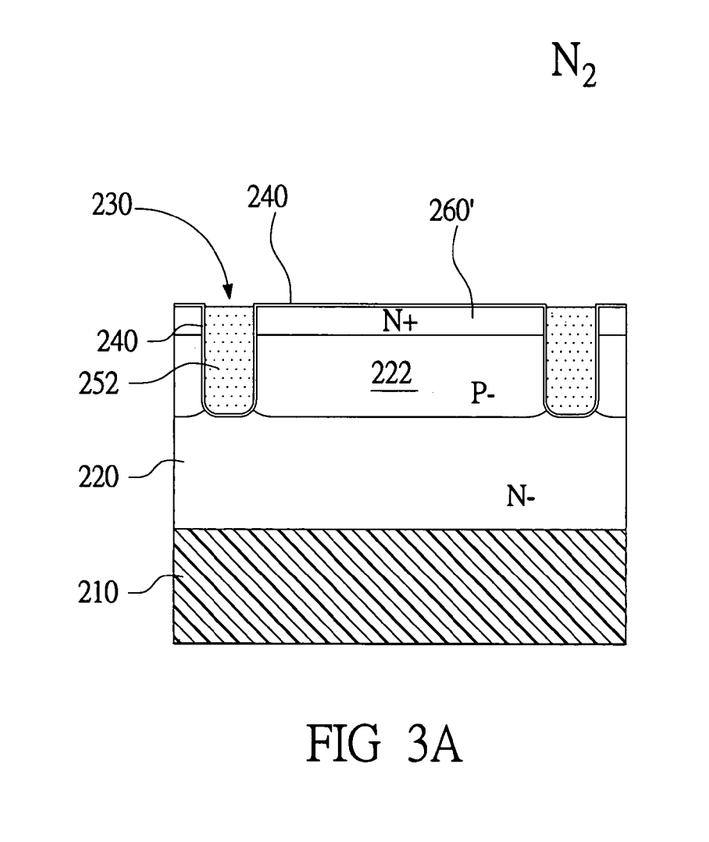
FIGS. 3A to 3D are schematic views showing another preferred embodiment of the fabrication method of a trenched power MOSFET in accordance with the present invention.

FIGS. 3A to 3D are schematic views of a fabrication method of the trenched power MOSFET according to another preferred embodiment of the present invention. The fabrication method shown in FIGS. 3A to 3D begins with the fabrication process of FIG. 2C. Referring to FIG. 3A, a blanket ion implantation process is performed to implant the N-type dopants into the P-type body 222 under the gate oxide layer 240. Afterwards, the implanted N-type dopants are driven-in by undertaking the thermal process in a pure-nitrogen environment, in order to form a plurality of N-type source regions 260 inside the P-type body 222.

Figure 3B:
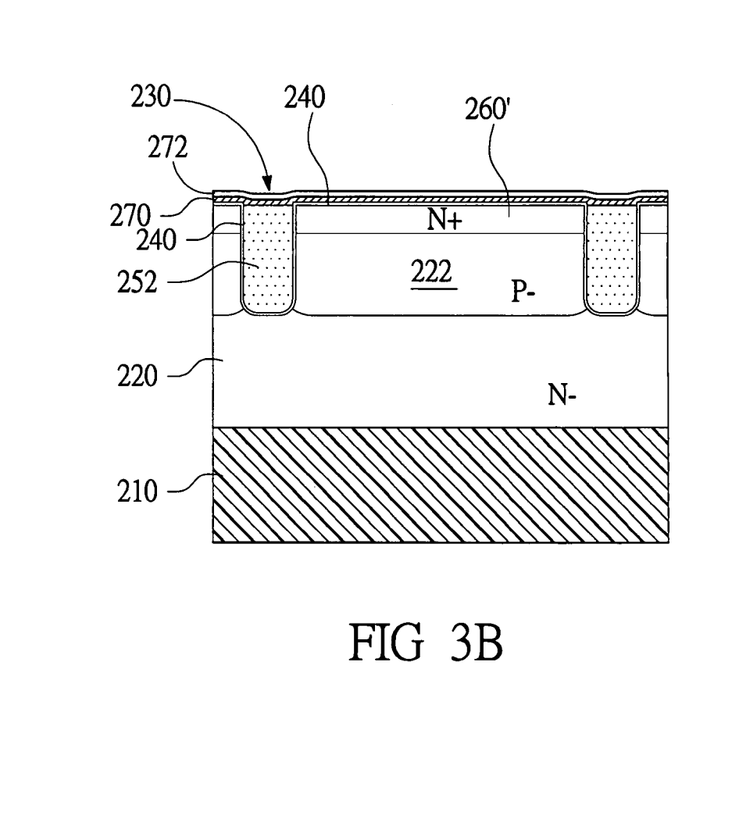

Later on, referring to FIG. 3B, the metal layer 270 is formed to cover the gate oxide layer 240 and the exposed surface of the polysilicon gates 252 by performing a sputtering process. Thereafter, referring to FIG. 3C, a thermal process is carried out to have the metal layer 270 reacting with the polysilicon gates 252 to form the self alignment silicide 274 on the upper surface of the polysilicon gates 252.

Figure 3C:
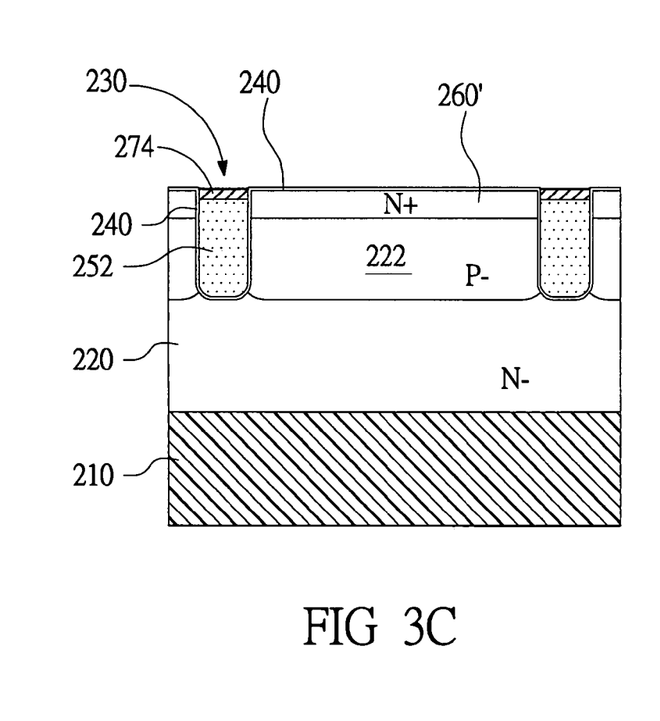
Figure 3D:
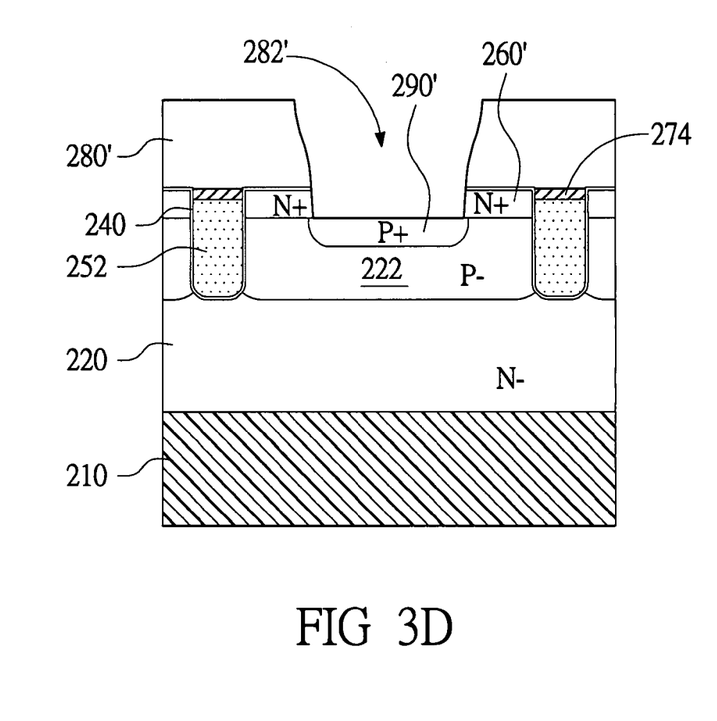

Afterward, referring to FIGS. 3C and 3D, the titanium nitride layer 272 and the remainder of the titanium metal layer 270 are removed. Then, a dielectric layer 280' is formed to cover the epitaxial layer 220 and the polysilicon gates 252 (including the self alignment silicide 274 on the upper surface of the polysilicon gates 252). A contact window 282' is then formed in the dielectric layer 280' by undertaking the etching process, It is noted that this etching process also remove a part of the source regions 260 beneath the contact window 282 so as to expose the P-type body 222 under the source regions 260. Then, through the contact window 282, an ion implantation process is carried out to form a P-type heavily-doped region 290 inside the P-type body 222. The fabrication method in accordance with the trenched power MOSFET of the present invention is thus finished.

Referring to FIGS. 1B and 1C, the ion drive-in step is performed in the high-oxygen environment in the typical fabrication method of trenched power MOSFET, in order to form a silicon oxide layer 140a on the surface of the epitaxial layer 120 to avoid the implanted dopants from spreading outwards. However, this step also forms a silicon oxide layer 140b on the surface of the epitaxial layer 152, which may affect the formation of the self alignment silicide. Meanwhile, the thickness of the silicon oxide layer 140b on the surface of the epitaxial layer 152 is generally greater than the thickness of the silicon oxide layer 140a on the surface of the epitaxial layer 120. Hence, it is difficult to remove the silicon oxide layer 140b on the surface of the epitaxial layer 152 and have the silicon oxide layer 140a left on the surface of the epitaxial layer 120 at the same time by undertaking the etching process over all exposed surface.

In comparison, referring to FIGS. 2C, 2D and 3A, the ion drive-in step of the present invention is carrying out in the pure-nitrogen environment instead of the high-oxygen environment. This can avoid the formation of silicon oxide layer on the surface of the polysilicon gates 252. Therefore, referring FIG. 2F, the present invention can use the gate oxide layer 240 as a mask for forming self alignment silicide on the exposed surface of the polysilicon gates 252 directly, in order to achieve the goal of reducing the resistance of the polysilicon gates 252.

As described above, the present invention completely fulfills the three requirements on patent application: innovation, advancement and industrial usability. In the aforementioned texts the present invention has been disclosed by means of preferred embodiments thereof; however, those skilled in the art can appreciate that these embodiments are simply for the illustration of the present invention, but not to be interpreted as for limiting the scope of the present invention. It is noted that all effectively equivalent changes or modifications on these embodiments should be deemed as encompassed by the scope of the present invention. Therefore, the scope of the present invention to be legally protected should be delineated by the subsequent claims.

What is claimed is:

1. A fabrication method of a trenched power MOSFET comprising steps of:
   providing a substrate and forming an epitaxial layer thereon;
   forming a plurality of gate trenches in the epitaxial layer;
   forming a gate oxide layer on an exposed surface of the epitaxial layer;
   forming a plurality of polysilicon gates in the gate trenches respectively;
   implanting dopants with a first conductivity type into the epitaxial layer below the gate oxide layer;
   driving-in the dopants with the first conductivity type in an oxygen-free environment to form a body below the gate oxide layer;
   implanting dopants with a second conductivity type into the body below the gate oxide layer;
   driving-in the dopants with the second conductivity type in an oxygen-free environment to form a plurality of source regions in the body;
   forming self alignment silicide (salicide) on exposed surfaces of the polysilicon gates by using the gate oxide layer as a mask;
   depositing a dielectric layer covering the epitaxial layer and the polysilicon gates and forming a contact window to expose the source region and part of the body; and
   forming a heavily-doped region with the first conductivity type into the body beneath the contact window.

2. The fabrication method of claim 1, wherein the oxygen-free environment to form the body and the oxygen-free environment to form the plurality of the source regions are substantially pure-nitrogen environments.

3. The fabrication method of claim 1, wherein the oxygen-free environment to form the body and the oxygen-free environment to form the plurality of the source regions are vacuum environments.

4. The fabrication method of claim 1, wherein the oxygen-free environment to form the body and the oxygen-free environment to form the plurality of the source regions are substantially inert gas environments.

5. The fabrication method of claim 1, wherein the step of forming the self alignment silicide comprising the steps of:
   forming a metal layer covering the gate oxide layer and the polysilicon gates; and
   applying a thermal processing to have the metal layer react with the polysilicon gates to form self alignment silicide.

6. The fabrication method of claim 5, wherein the thermal processing is a rapid thermal processing.

7. The fabrication method of claim 5, wherein the metal layer is a titanium metal layer.

8. The fabrication method of claim 5, wherein after the step of forming the metal layer, further comprising a step of forming a titanium nitride layer covering the metal layer.

9. The fabrication method of claim 1, wherein the drive-in step of the dopants with the first conductivity type is performed at 1000° C.~1150° C. for about 20~50 minutes.

10. The fabrication method of claim 1, wherein the drive-in step of the dopants with the second conductivity type is performed at 850° C.~950° C. for about 15~30 minutes.

11. The fabrication method of claim 1, wherein before the step of implanting the dopants with the second conductivity type into the body, further comprising a step of forming a patterned photoresistant layer on the gate oxide layer to define locations of the source regions.

12. The fabrication method of claim 1, wherein the dopants with the second conductivity type are implanted in the body below the gate oxide layer by performing blank implant.

13. The fabrication method of claim 12, wherein in the step of forming the contact window, part of the source regions beneath the contact window is removed simultaneously to expose the body under the source regions.

14. The fabrication method of claim 1, wherein after the step of forming the source regions, upper surfaces of the polysilicon gates are substantially remained exposed.

* * * * *